United States Patent [19]

Schellenberg et al.

[11] 4,234,854
[45] Nov. 18, 1980

[54] AMPLIFIER WITH RADIAL LINE DIVIDER/COMBINER

[75] Inventors: James M. Schellenberg, Severna Park; Marvin Cohn, Baltimore, both of Md.

[73] Assignee: Westinghouse Electric Corp., Pittsburgh, Pa.

[21] Appl. No.: 905,604

[22] Filed: May 12, 1978

[51] Int. Cl.³ .............................................. H03F 3/60
[52] U.S. Cl. .................................... 330/286; 330/295; 333/137
[58] Field of Search ............... 330/53, 56, 124 R, 286, 330/287, 295; 333/6, 24 R, 34, 84 M

[56] References Cited

U.S. PATENT DOCUMENTS

| 3,582,813 | 6/1971 | Hines | 333/34 X |
|---|---|---|---|
| 3,775,694 | 11/1973 | Quine | 333/24 R X |
| 3,942,130 | 3/1976 | Harp | 330/287 |
| 3,958,247 | 5/1976 | Bogner et al. | 333/6 X |
| 4,091,334 | 5/1978 | Sechi | 330/286 X |

OTHER PUBLICATIONS

Bearse, "Compact Radial Power Combiner Teams up a Dozen Power GaAs FETS", *Microwaves*, Oct. 1977, p. 9.

*Primary Examiner*—James B. Mullins
*Attorney, Agent, or Firm*—R. M. Trepp

[57] ABSTRACT

A power amplifier that divides input power among a plurality of parallel channels through a radial line divider, amplifies the power in each channel with three terminal devices, and combines the amplified power in a radial line combiner to produce an output signal. The radial line divider/combiner includes a radial transmission line having a plurality of sectors symmetrically disposed around the inner radius of a supporting annular substrate. The sectors are connected to respective three terminal devices through microstrip transmission lines, and are isolated from laterally adjacent sectors by thin film isolation resistors.

11 Claims, 3 Drawing Figures

AMPLIFIER WITH RADIAL LINE DIVIDER/COMBINER

GOVERNMENT CONTRACT

The Government has rights in this invention pursuant to Contract No. F-33615-76-C-1139 awarded by the United States Air Force.

BACKGROUND OF THE INVENTION

1. Field of the Invention

The present invention relates to power amplifiers and, more particularly, to microwave power amplifiers employing microwave integrated circuit fabrication techniques.

2. Description of the Prior Art

In the pertinent art, semiconductor devices that operate on a signal to modify the signal characteristics in a selectively controlled manner are generally referred to as active semiconductor devices. Examples are field-effect transistors (FET) and insulated-gate field-effect transistors (IGFET). Active semiconductor devices with relatively high power capabilities have generally been constructed by merely paralleling a number of cells in the active device. However, paralleling cells in a single device results in fundamental disadvantages and limitations in the device operating parameters, such as efficiency and input/output impedance. These disadvantages limit the number of device cells that can be used together and, therefore, the total power amplification that can be achieved.

As used herein, elemental amplifiers are specifically defined to be an active device together with impedance matching networks and/or stabilization networks associated therewith. As also used herein, composite amplifiers are specifically defined to be an array or group of separate active devices or elemental amplifiers that are electrically interconnected to form an amplifying circuit. In the past, composite amplifiers have employed a plurality of active devices or elemental amplifiers in various circuit combinations to construct amplifier circuits with high power capacity.

Generally, composite amplifiers have been found to have more satisfactory performance than single active devices or single elemental amplifiers because more active devices or elemental amplifiers can be combined in the circuit of a composite amplifier than the number of cells that can be parallel constructed in a single active device. It has also been found that the composite amplifier is less sensitive to variations between elemental amplifier parameters than when the device cells are combined directly. Another advantage in combining the elemental amplifiers in a composite amplifier is that isolation between elemental amplifiers can be provided when they are combined on a circuit level as in composite amplifiers.

Furthermore, the output power tends to be affected in a predictable manner upon failure of one or more of the elemental amplifiers whereas the failure of one or more parallel cells tends to cause unpredictable changes in the output power for the device.

In the prior art, composite power amplifiers which have generally operated at L and S-band frequencies, have generally employed bipolar power devices. However, at X-band, techniques developed for bipolar amplifiers are too inefficient or have too narrow a bandwidth to have useful application. For example, the power amplifier comprising a binary tree of quadrature or in-phase hybrids has been found to have high isolation between transistors over a wide bandwidth, but is too inefficient at X-band to be used to combine more than four devices. Furthermore, the binary nature of that amplifier circuit requires that $2^n$ devices (where n is an integer) must be combined to avoid wasting power.

Combining techniques for power amplifiers that have adequate efficiency at X-band have been developed. However, the bandwidth of these amplifiers has been found to be unacceptably narrow. For example, a resonant cavity power combiner is known which combines power from two terminal elemental amplifiers at X-band frequencies with high efficiency. However, the high-Q of the resonant cavity power combiner makes the composite amplifier inherently narrow band.

Another significant limitation of prior combiner circuits is that they have generally been unable to take advantage of the lower production costs and other benefits of planar metallization technology. For example, planar metallization technology has not generally been applied to the N-way Wilkinson combiner because of topological problems that arise in physically locating the isolating resistors so that they can be conveniently assembled but yet can properly dissipate incident power upon failure of the elemental amplifiers. Inadequate capacity of the isolating resistors to dissipate power causes unpredictable effects in the power output level of the composite amplifier upon failure of an elemental amplifier.

Accordingly, there was a need in the prior art for a composite power amplifier that was efficient that had wide bandwidth at X-band frequencies, and that could be produced in accordance with planar metallization technology.

SUMMARY OF THE INVENTION

In accordance with the present invention, a composite amplifier comprises a radial line power divider in which a radial transmission line is divided into a plurality of sectors that are symmetrically disposed on an annular substrate such that the input signal is evenly divided in phase and amplitude among the radial line sectors. A plurality of elemental amplifiers are connected to each of the radial line sectors to amplify the power in each sector. A radial line power combiner has a radial transmission line divided into a plurality of sectors that are symmetrically disposed on an annular substrate and connected to the elemental amplifiers such that the combiner evenly combines the output of the elemental amplifiers in phase and amplitude to provide a composite amplifier output signal.

Preferably, the radial line power divider and the radial line power combiner further include a plurality of transmission lines that radially extend from the perimeter of the radial transmission line to the outer radius of the substrate.

Also preferably, the radial line power divider and the radial line power combiner further include a plurality of isolation resistors connected between laterally adjacent sectors of the radial line divider or combiner.

Other details, objects and advantages of the invention will become apparent as the following description of a present preferred embodiment thereof and a present preferred method of practicing the invention proceeds.

BRIEF DESCRIPTION OF THE DRAWINGS

The accompanying drawings show a present preferred embodiment of the invention and illustrate a present preferred method of practicing the same in which.

DESCRIPTION OF THE PREFERRED EMBODIMENT

Figure 1:
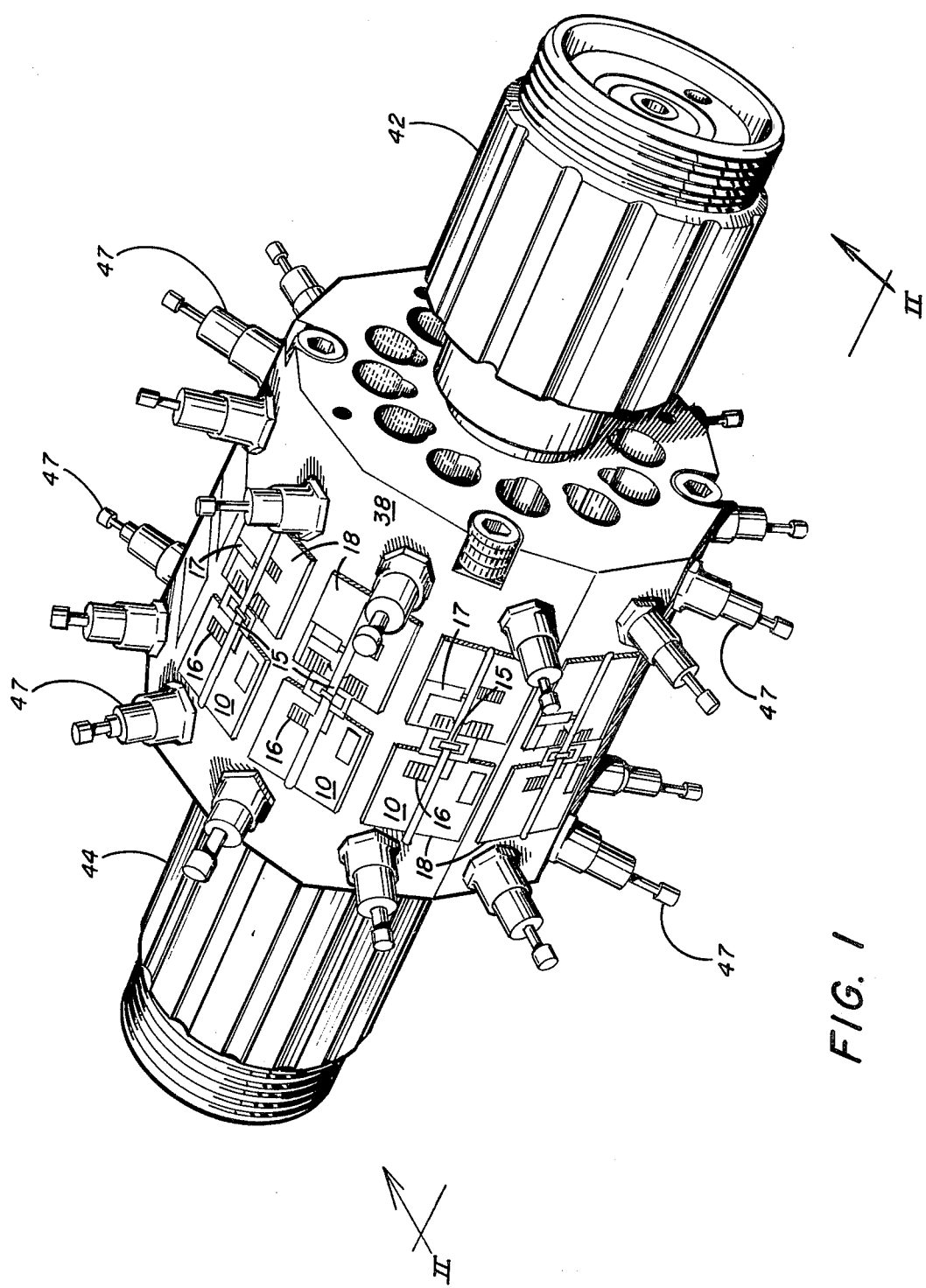
FIG. 1 is an isometric drawing of the presently disclosed composite power amplifier.
Figure 2:
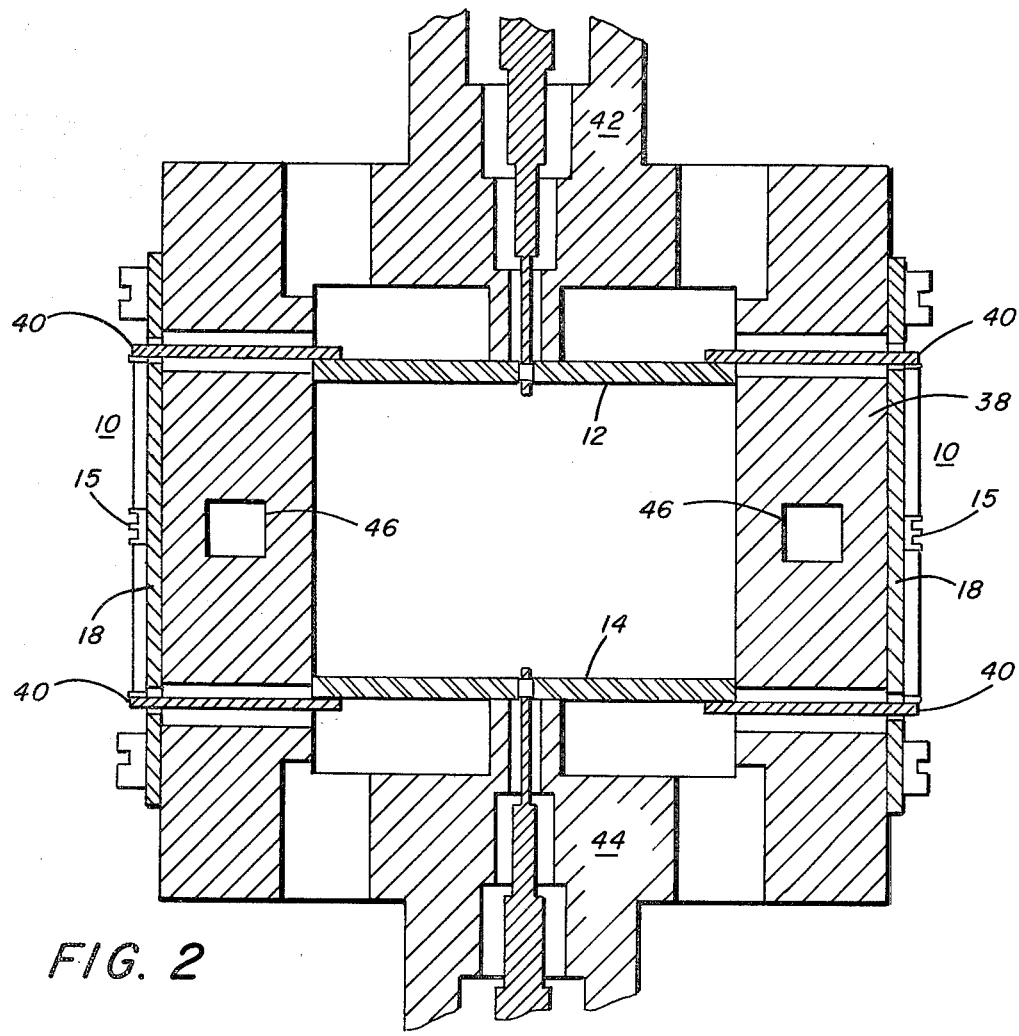
FIG. 2 is a cross-sectional view of the composite power amplifier taken along the lines II—II of FIG. 1.
Figure 3:
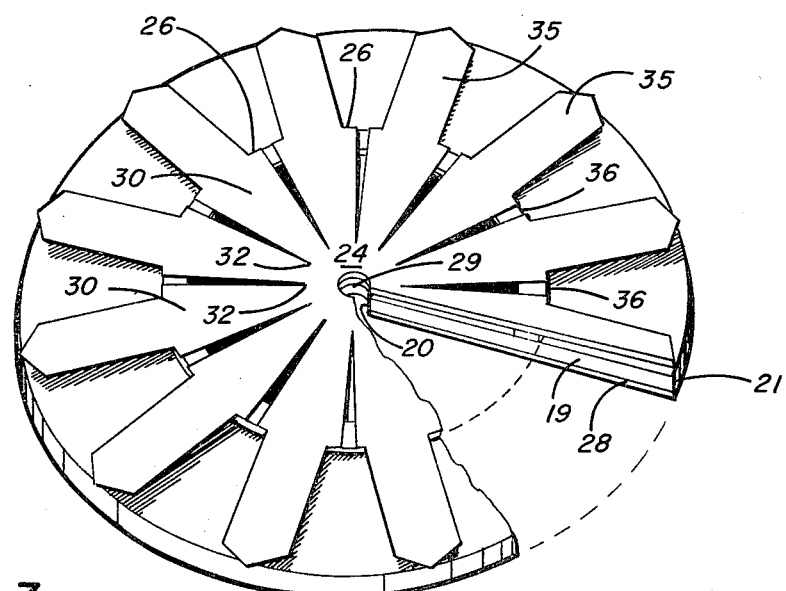
FIG. 3 is a sectioned isometric view of the presently disclosed sectored radial line divider/combiner.

As shown in FIGS. 1-3, the presently preferred embodiment of the invention includes a composite power amplifier and a method for amplifying power in accordance with the operation thereof. The composite amplifier includes a plurality of elemental amplifiers 10 connected between first and second sectored radial line radial divider/combiners 12 and 14 respectively. Each elemental amplifier 10 is comprised of a three terminal active device 15 and associated matching network 16 and stabilization network 17 mounted on a suitably dimensioned carrier 18. Preferably, device 15 is comprised of a field effect transistor (FET) and carrier 18 is comprised of molybdenum. Radial divider/combiners 12 and 14 are substantially identical and, depending on their particular arrangement in the composite amplifier, either operate as a power divider by evenly dividing the input signal in phase and amplitude, or operate as a power combiner by evenly combining the output of elemental amplifiers 10 in phase and amplitude. In the presently preferred embodiment, radial divider/combiner 12 is used as a divider and radial divider/combiner 14 is used as a combiner.

An example of radial divider/combiners 12 and 14 is shown more specifically in FIG. 3. Divider/combiners 12 and 14 are each comprised of an annular substrate 19 having an inner radius 20 and an outer radius 21. Preferably, annular substrate 19 is comprised of fused quartz or ceramic material. Fused silica is most preferred at X-band because of its low dielectric constant and optical quality surface finish. The low dielectric constant increases the electrical size by about 50 percent for a given frequency compared to alumina or sapphire.

A radial line 24 having a perimeter 26 is centrally disposed on one major surface of annular substrate 19 with the opposing major surface of annular substrate 19 being entirely covered by a metal layer 28. A central port 29 is provided in the center of radial line 24 such that radial line 24 can be excited from a coaxial line. Radial line 24 also has a plurality of sectors 30 symmetrically disposed about the center of annular substrate 19 and connected together at an inner radius 32 of radial line 24. The electrical length of sectors 30 between inner radius 32 and perimeter 26 is 90 degrees. While radial line 24 can have different numbers of sectors 30 corresponding to the total number of elemental amplifiers 10, in the present embodiment, there are twelve elemental amplifiers 10 and, therefore, twelve sectors 30. Preferably, radial line 24 is fabricated using planar thin-film techniques.

A plurality of transmission lines 35 are also located on annular substrate 19 and radially extend from radial line perimeter 26 to annular substrate outer radius 21. Preferably, transmission lines 35 are microstrip transmission lines.

Near radial line perimeter 26, a plurality of isolation resistors 36 connect laterally adjacent radial line sectors 30. Preferably, isolation resistors 36 are tantalum thin film resistors, although discrete chip resistors can also be used. Isolation resistors 36 provide electrical isolation between radial line sectors 30 to protect the composite amplifier against impedance mismatch, instability, and failure of elemental amplifiers 10. Connecting isolation resistors 36 in this manner avoids the topological problems encountered by prior composite amplifiers. The degree of isolation between sectors 30 is somewhat dependant upon the extent of physical separation between the particular sectors.

Radial divider/combiners 12 and 14 have been found to offer many advantages over divider/combiners of the prior art. For example, power is equally divided into or combined out of sectors 30 in both phase and amplitude. Also, the radial symmetry of radial divider/combiners 12 and 14 permits shorter line lengths and, therefore, lower line losses in comparison to linear dividers/combiners. The efficiency advantages afforded by the shorter line lengths associated with radial line divider/combiners 12 and 14 becomes more pronounced as the number of elemental amplifiers 10 is increased. Furthermore, the radial symmetry of radial line divider/combiners 12 and 14 eliminates combining losses caused by current crowding effects such as experienced in microstrip transmission lines.

Advantageously, radial line divider/combiners 12 and 14 operate as wideband impedance transformers that transform a multiple of impedances at the peripheries of sectors 30 to an impedance value at central port 29 which is substantially equivalent to the periphery impedance of just one sector 30. For example, if the impedance at the periphery of each sector 30 is 50 ohms and there are twelve sectors, radial line 24 transforms the twelve 50 ohm impedances to a single 50 ohm impedance at central port 29. Due to the symmetry of radial line 24, the transformation results in equal amplitude and phase signals at the peripheries of sectors 30. The impedance transforming capacity of radial line divider/combiners 12 and 14 is operative for broad bandwidths, typically in the range of 30-35%.

One radial line divider/combiner 12 or 14 which was actually built and tested over an 8-10 GHz frequency range was found to have a 1 dB bandwidth of 2.79 GHz or 31.2 percent. The radial line divider/combiner included twelve sectors 30. The power division variation between sectors 30 was found to be ±0.25 dB and the phase imbalance between sectors 30 was found to be ±5 degrees. The total insertion loss for all twelve sectors 30 was estimated to be in the range of 11.0-11.1 dB at the center frequency, thereby indicating a total dissipation loss in the range of about 0.2 to 0.3 dB above the ideal twelve-way power division loss of 10.8 dB.

Referring again more specifically to FIGS. 1 and 2, it is shown that, in the composite amplifier, elemental amplifiers 10 are positioned around the outer circumference of a generally cylindrical housing 38 with radial line divider/combiners 12 and 14 cross-sectionally disposed within cylindrical housing 38. Miniature coaxial lines 40 extend radially through cylindrical housing 38 and connect transmission lines 35 to microstrip input/output ports of elemental amplifiers 10. Coaxial-radial line transitions 42 and 44 step down the diameter of the coaxial input and output lines (not shown) and provide matching networks to match the inductive component of the input impedance of radial line divider/combiners 12 and 14. In the preferred embodiment, a series of three steps is used to make the transition between coaxial input and output lines and the radial line divider/combiners 12 and 14. Preferably, a cooling water channel 46 is provided in cylindrical housing 38 adjacent the location of elemental amplifiers 10 to stabilize the temperature of the composite amplifier. Extention terminals 47 (shown in FIG. 1 only) provide terminals for connecting external biasing circuits (not shown) to elemental amplifiers 10. In the preferred embodiment, extension terminals 47 cover screws 48 which fasten elemental amplifiers 10 to the outer circumference of generally cylindrical housing 38.

The impedance transforming capacity of radial lines 24 in power divider/combiners 12 and 14 permits independent design of radial line divider/combiners 12 and 14, and elemental amplifiers 10. Although elemental amplifiers 10 are nominally matched to a reference impedance, all the parameters of the separate amplifiers are not precisely identical. Accordingly, elemental amplifiers 10 and radial line divider/combiners 12 and 14 are separately characterized and pre-tuned prior to final assembly. In accordance with the design of the presently preferred embodiment, the location of elemental amplifiers 10 about the outer circumference of generally cylindrical housing 38, renders elemental amplifiers 10 highly accessable so that characterization, pre-tuning, testing, and, when necessary, replacement can be accomplished with facility.

In the operation of the composite amplifier herein disclosed, an input signal is provided from a coaxial input line to the central port 29 of radial line divider 12 through coaxial-radial line transition 42. From central port 29, the input signal is evenly divided in phase and amplitude among the twelve sectors 30 and the divided signals transmitted to outer radius 21 of annular substrate 19 through transmission lines 35. Miniature coaxial lines 40 carry the signals of transmission lines 35 to the input strip lines of elemental amplifiers 10.

Elemental amplifiers 10 amplify each respective signal and the amplified signals are then combined in substantially the inverse procedure described above. Specifically, miniature coaxial lines 40 carry the output of elemental amplifiers 10 from the amplifier output strip lines to transmission lines 35 of radial line combiner 14. The amplified signals travel through transmission lines 35 to sectors 30 of radial line 24 where they are combined to provide an output signal at central port 29 of radial line combiner 14. This output signal is provided through coaxial-radial line transition 44 to provide a composite amplifier output signal.

Impedance matching is accomplished in accordance with the matching networks of coaxial-radial line transitions 42 and 44 and matching networks 16 of elemental amplifiers 10. Stabilization of the composite amplifier is maintained through stabilization networks 17 of elemental amplifiers 10. Substantial electrical isolation between elemental amplifiers 10 is accomplished through isolation resistors 36 of both radial line divider/combiners 12 and 14.

Two composite amplifiers that have actually been built in accordance with the forgoing description have demonstrated the following parameters:

| Parameter | First Amplifier | Second Amplifier |
| --- | --- | --- |
| Center Frequency | 8.5 GHz | 9.0 GHz |
| Power Bandwidth (1dB) | 8.25–8.75 GHz | 7.7–9.9 GHz |
| Output Power | 4.4 watts | 10.9 watts |
| Associated Gain | 4 dB | 4.3 dB |
| Small Signal Gain | 5.4 dB | 5.7 dB |
| Power Added Efficiency | 15.4% | 24.3% |
| Combining Efficiency | 87.4% | 90% |

Both amplifiers included twelve elemental amplifiers 10 comprised of FET devices. The principal difference between these composite amplifiers was in the particular FET devices chosen with the second amplifier employing higher power FET's and broad-band matching networks in elemental amplifiers 10. For both composite amplifiers, the broadband nature of radial line divider/combiners 12 and 14 was demonstrated by the fact that the bandwidth of the composite amplifier was limited only to the bandwidth of the elemental amplifiers 10.

Yet another significant characteristic of the disclosed composite amplifier is the gradual effect of failure of individual elemental amplifiers 10 on the total output power of the composite amplifier. That is, if a single elemental amplifier 10 should fail, the remaining elemental amplifiers 10 are substantially unaffected such that this composite amplifier continues to deliver substantial power at the output port of coaxial-radial line transition 44. For example, with a twelve element composite amplifier, the failure of a single elemental amplifier 10 reduces the output power of the composite amplifier by an amount of only about 0.8 dB. Three failures decrease the output power by only about 2.5 dB. Accordingly, the presently disclosed composite amplifier affords inherently high reliability.

Due to the sector dependent isolation properties of the radial line divider/combiners 12 and 14, the effect on total output power of the failure of elemental amplifiers 10 of the composite amplifier is slightly dependent upon the particular sequence in which elemental amplifiers 10 happen to fail. However, when only a relatively few elemental amplifiers 10 have failed, the effect of the failure sequence on output power is negligible. For example, taking different device failure sequences of the first amplifier in the foregoing table, the output power reduction for the composite amplifier deviated by only about 0.15 dB.

In accordance with the foregoing description, the presently disclosed invention is one that is efficient and has wide bandwidth at X-band frequencies, and that can be produced by planar mettalization technology. Furthermore, failure of undivided elemental amplifiers has been found to have a gradual effect on the total output power of the disclosed composite amplifier.

While a presently preferred embodiment of the invention has been shown and described and a presently preferred method of practicing the invention illustrated, it is to be understood the invention is not limited thereto but may be otherwise variously embodied within the scope of the following claims.

We claim:

1. A radial line divider/combiner comprising:
    an annular substrate having an inner radius and an outer radius;
    a radial line covering selected portions of a major surface of the annular substrate, said radial line having a plurality of sectors symmetrically disposed about the center of the annular substrate;

a plurality of transmission lines radially extending from the perimeter of the radial line to the outer radius of the substrate; and a plurality of isolation resistors connecting laterally adjacent sectors of the radial line.

2. The radial line divider/combiner of claim 1 wherein said transmission lines are microstrip transmission lines.

3. The radial line divider/combiner of claim 2 wherein said isolation resistors are thin film resistors.

4. A composite amplifier comprising:

a radial line power divider having a first radial transmission line supported on an annular substrate, the first radial transmission line having a plurality of sectors that are symmetrically disposed around the inner radius of the annular substrate such that said sectors cooperate to divide the input signal, said radial line power divider including a plurality of isolation resistors connecting adjacent sectors of said first radial transmission line;

a plurality of elemental amplifiers corresponding to the number of sectors of the radial line power divider;

first means for connecting each of said amplifiers to a respective sector of the radial line power divider such that the amplifier amplifies the power divided into that respective sector;

a radial line power combiner having a second radial transmission line supported on an annular substrate, the second radial transmission line having a plurality of sectors that are symmetrically disposed around the inner radius of the annular substrate, said radial line power combiner including a plurality of isolation resistors connecting adjacent sectors of said second radial transmission line; and second means for connecting each of said amplifiers to a respective sector of the radial line power combiner such that the radial line power combiner combines the output of the elemental amplifiers to provide a composite amplifier output signal.

5. The composite amplifier of claim 4 wherein said power divider and said power combiner each include a plurality of transmission lines that radially extend from the perimeter of the first and second radial transmission line to the outer radius of the supporting annular substrate, the transmission lines of said power divider connecting one sector of the divider to one elemental amplifier, and the transmission lines of said power combiners connecting one sector of the combiner to one elemental amplifier.

6. The composite amplifier of claim 5 wherein transmission lines are microstrip transmission lines.

7. The composite amplifier of claim 4 wherein said isolation resistors are thin film resistors.

8. The composite amplifier of claim 4 wherein said first and second connecting means include coaxial lines.

9. The composite amplifier of claim 4 wherein said elemental amplifiers include a three terminal active device, an impedance matching network, and a stabilization network.

10. The composite amplifier of claim 4 further comprising:

a coaxial transmission line for carrying an input signal; said coaxial transmission line coupled to said plurality of sectors of said first radial transmission line at said inner radius.

11. The composite amplifier of claim 4 further comprising:

a coaxial transmission line for carrying an output signal; said coaxial transmission line coupled to said plurality of sectors of said second radial transmission line at said inner radius.

* * * * *